United States Patent [19]

Masuhara et al.

[11] 4,199,778
[45] Apr. 22, 1980

[54] INTERCONNECTION STRUCTURE FOR SEMICONDUCTOR INTEGRATED CIRCUITS

[75] Inventors: Toshiaki Masuhara, Hachioji; Tokumasa Yasui, Kodaira; Yoshio Sakai, Hachioji; Joh Nakajima, Kodaira; Yasunobu Kosa, Kodaira; Satoshi Meguro, Kodaira; Masaharu Kubo, Hachioji, all of Japan

[73] Assignee: Hitachi, Ltd., Japan

[21] Appl. No.: 843,366

[22] Filed: Oct. 19, 1977

[30] Foreign Application Priority Data

Oct. 22, 1976 [JP] Japan ................. 51-126051

[51] Int. Cl.$^2$ .................. H01L 29/04; H01L 23/48; H01L 29/44
[52] U.S. Cl. ................... 357/59; 357/65; 357/68; 357/71
[58] Field of Search .............. 357/59, 65, 68, 23, 357/71

[56] References Cited

U.S. PATENT DOCUMENTS

| | | | |
|---|---|---|---|
| 3,456,335 | 7/1969 | Hennings et al. | 357/59 |
| 3,600,651 | 8/1971 | Duncan | 357/59 |
| 3,771,026 | 11/1973 | Asai et al. | 357/59 |
| 3,902,188 | 8/1975 | Jacobson | 357/59 |
| 3,943,286 | 3/1976 | Tsurushima | 357/59 |
| 3,950,188 | 4/1976 | Bower | 357/59 |
| 4,005,455 | 1/1977 | Watrous et al. | 357/59 |
| 4,008,484 | 2/1977 | Maekawa et al. | 357/59 |
| 4,041,522 | 8/1977 | Oguey et al. | 357/59 |
| 4,110,776 | 8/1978 | Rao et al. | 357/59 |
| 4,125,854 | 11/1978 | McKenny et al. | 357/59 |
| 4,128,845 | 12/1978 | Sakai | 357/59 |

Primary Examiner—Andrew J. James
Attorney, Agent, or Firm—Craig and Antonelli

[57] ABSTRACT

In a semiconductor integrated circuit having polycrystalline silicon interconnections and metal interconnections, a low resistance layer, containing impurities to a high concentration for the polycrystalline silicon interconnections, is formed in predetermined parts of an undoped polycrystalline silicon layer which is deposited on a first insulator film on a semiconductor substrate, a second insulator film is deposited on the polycrystalline silicon layer under the state under which the undoped parts are left at least around through-holes to be formed, and the metal interconnections at least parts of which run in a direction intersecting the polycrystalline silicon interconnections are provided on the second insulator film, the necessary contacts between the metal interconnections and the polycrystalline silicon interconnections being made through the through-holes provided in the second insulator film in correspondence with the intersecting parts of both the interconnections.

7 Claims, 8 Drawing Figures

4,199,778

INTERCONNECTION STRUCTURE FOR SEMICONDUCTOR INTEGRATED CIRCUITS

BACKGROUND OF THE INVENTION

1. Field of the Invention

This invention relates to an interconnection structure for a semiconductor integrated circuit having polycrystalline silicon interconnections and metal interconnections.

1. Description of the Prior Art

A semiconductor integrated circuit having polycrystalline silicon interconnections and metal interconnections is described in, for example, "MOS Integrated Circuits" edited by William M. Penney and Lillian Lau in "Microelectronics Series" published by Van Nostrand Reinhold Company. Wiring in such a circuit is effect as stated below. Polycrystalline silicon interconnections which contain impurities at a high concentration are provided in predetermined regions on a first insulating film on a semiconductor substrate which forms a semiconductor body including transistors therein. A second insulating film, and metal interconnections in a direction intersecting the polycrystalline silicon interconnections are provided on the polycrystalline silicon interconnections. The necessary contacts or connections between the metal interconnections and the polycrystalline silicon interconnections are made through through-holes provided in the second insulating film in correspondence with the intersecting parts of the different interconnections.

According to this expedient, for providing the through-holes, portions which are several microns larger than the contacts between the different interconnections must be formed in the polycrystalline silicon interconnections of the high impurity concentration on account of mask alignment tolerances. This lends to the disadvantage that the interconnection pitch cannot be made small.

SUMMARY OF THE INVENTION

An object of this invention is to provide an interconnection structure for a semiconductor integrated circuit having polycrystalline silicon interconnections and metal interconnections, which permits high density interconnections.

Another object of this invention is to provide an interconnection structure for a semiconductor integrated circuit having polycrystalline silicon interconnections and metal interconnections, in which leakage currents between the polycrystalline silicon interconnections, attributed to parasitic channels, are low.

In order to accomplish the first-mentioned object, in the interconnection structure according to this invention for a semiconductor integrated circuit having polycrystalline silicon interconnections and metal interconnections, a low resistance layer, containing impurities at a high concentration for the polycrystalline silicon interconnections, is formed in predetermined parts of an undoped polycrystalline silicon layer which is deposited on a first insulating film on a semiconductor substrate, a second insulating film is deposited on the polycrystalline silicon layer under the state under which the undoped parts are left at least around through-holes to be formed, and the metal interconnections at least parts of which run in a direction intersecting the polycrystalline silicon interconnections are provided on the second insulating film, the necessary contacts between the metal interconnections and the polycrystalline silicon interconnections being made through the through-holes provided in the second insulating film in correspondence with the intersecting parts of the different interconnections.

In order to accomplish the second-mentioned object, in the interconnection structure according to this invention for a semiconductor integrated circuit having polycrystalline silicon interconnections and metal interconnections, when the low resistance layer is p-conductivity type, it can be biased to any potential with respect to the substrate, because parasitic channel is undoped polycrystalline silicon is not be formed, whereas, when the low resistance layer is n-conductivity type, it be desirable that it is biased to be higher than $-5$ V (i.e., to be a negative voltage smaller than 5 V in the absolute value, the zero voltage, or a positive voltage) with respect to a layer which lies directly under the low resistance layer through the insulating film. For this reason, when both the low resistance layer and the semiconductor substrate are n-conductivity type, a p-type region is formed in that surface portion of the semiconductor substrate which faces to the interconnection structure with the first insulating film intervening therebetween, and it is grounded.

While other advantages and features of this invention will become more apparent from the description of several preferred embodiments of the invention taken with reference to the accompanying drawing, it is a matter of course that they are for mere illustration and that various modifications and improvements can be made without departing from the spirit and scope of the invention.

DESCRIPTION OF THE PREFERRED EMBODIMENTS

EXAMPLE 1

Figure 1:
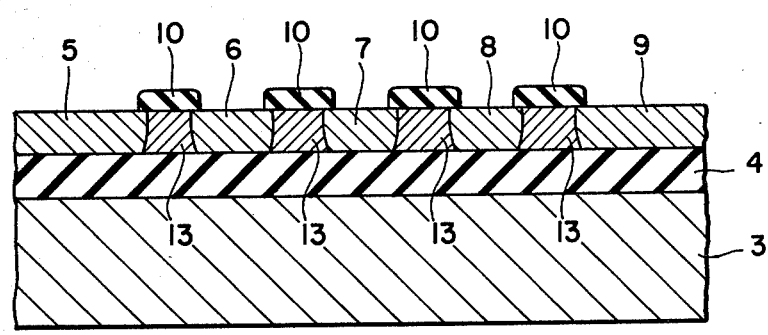
FIGS. 1 and 2 are sectional views showing the manufacturing process of an interconnection structure for a semiconductor integrated circuit according to this invention.

In FIG. 1, in order to facilitate an understanding of the subject matter of this invention, only an interconnection structure according to this invention is shown in section, and a semiconductor body which includes transistors therein and which lies on either side or both sides of the interconnection structure is not depicted.

Figure 2:
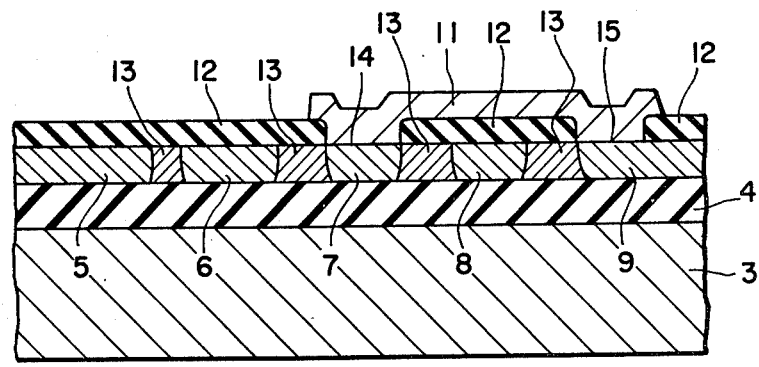

Referring to FIG. 1, an $SiO_2$ film 4 which is about 10,000 Å thick and which serves as an insulating film is grown on a silicon substrate 3 by the thermal oxidation. Further, a polycrystalline silicon layer 13 (having a sheet resistance of above 100 $K\Omega/\square$, typically $10^9 \Omega/\square - 10^{10} \Omega/\square$) which is not doped with any impurity and which is about 3,0000 Å–8,000 Å thick is deposited on the $SiO_2$ film 4. Subsequently, an $SiO_2$ film 10 is formed on the polycrystalline silicon layer 13 by deposition or thermal oxidation. Openings are provided in predetermined positions of the $SiO_2$ film 10 by photolithography. An impurity, such as boron or such as phosphorus and arsenic, is diffused into the polycrystalline silicon layer through the openings (by way of example, in an amount of above $1 \times 10^{19}$ atoms/cm$^3$). Owing to the diffusion, the polycrystalline silicon layer is divided into interconnection portions of low resistance (below 1 $K\Omega/\square$) 5–9 and insulating portions of high resistance (above 100 $K\Omega/\square$) 13. Further, the insulating film 10 is removed. Thereafter, as illustrated in FIG. 2, an $SiO_2$ film 12 is again deposited over the entire surface of the resultant structure, through-holes 14 and 15 are provided by the photolithography, and for example, the low resistance portions 7 and 9 are connected by an Al interconnection layer 11.

Figure 3:
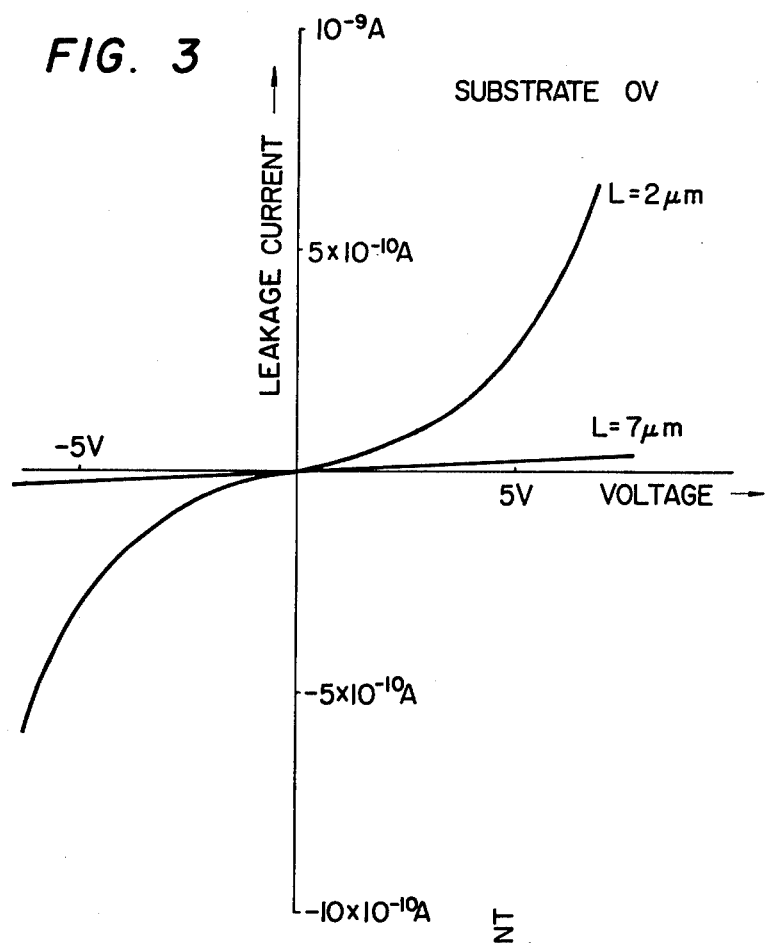
FIG. 3 is a diagram showing the current-voltage characteristics of a polycrystalline silicon layer in which no impurity is diffused (in the case where p+ diffused layers are formed on both sides of an insulating portion of high resistance).

As illustrated in FIG. 1, a p-type impurity such as boron was diffused into a polycrystalline silicon layer 10 μm wide and 5,000 Å thick, and low resistance layer portions were formed at fixed distances L. FIG. 3 gives as a function of the applied voltage the variation of current which flowed through an insulating portion of high resistance formed between the low resistance layer portions at this time. As is apparent from the figure, even when the width is 10 μm and the distance L is 2 μm, a current of about $3 \times 10^{-10}$ A flows at 5 V. Such a leakage current to such extent is negligible compared to the operating current of the circuit. Where a p-type impurity is diffused in the low resistance portions, the current-voltage characteristics exhibit substantially symmetrical curves for the cases where a positive voltage and a negative voltage are applied to the polycrystalline silicon electrode, while the other silicon electrode and the substrate are kept at zero potential. Accordingly, both polarities can be used.

Figure 4:
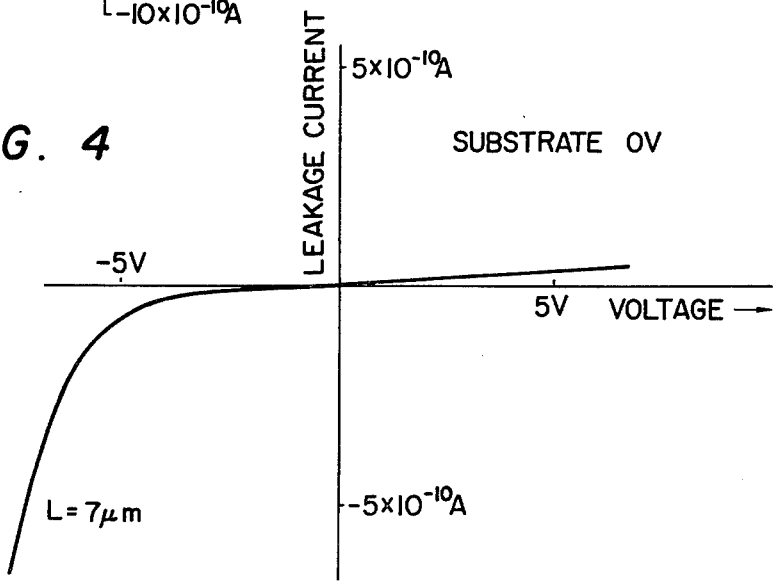
FIG. 4 is a diagram showing the current-voltage characteristics of a polycrystalline silicon layer in which no impurity is diffused (in the case where n+ diffused layers are formed on both sides of an insulating portion of high resistance).

On the other hand, where an n-type impurity such as phosphorus and arsenic is diffused in the low resistance portions, the variation of current through the insulating portion of polycrystalline silicon becomes that shown in FIG. 4. As is apparent from the figure, when a potential lower than $-5$ V (i.e., a negative potential greater than 5 V in the absolute value) with respect to the substrate maintained at the zero potential is applied to the polycrystalline silicon layer, the resistance value of the insulating portion becomes small. This is attributed to the fact that electrons are induced at the substrate-side bottom of the insulating portion of the polycrystalline silicon layer due to the substrate voltage, in other words, a parasitic channel is created.

EXAMPLE 2

Figure 5:
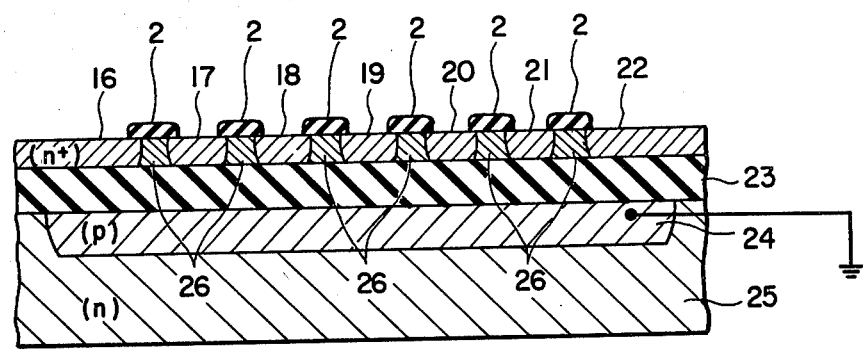
FIG. 5 is a sectional view showing another aspect of performance corresponding to FIG. 1, of the interconnection structure for a semiconductor integrated circuit according to this invention.

As explained in Example 1, no problem occurs in the case where, as in n-channel MOSICs, a positive voltage with respect to the substrate is always applied to the interconnection portions. In contrast, where, as in CMOSICs (complementary MOS integrated circuits), the n-type substrate is biased to a positive potential and the interconnection portions vary from the zero potential to a positive potential, the potential of the interconnection portions must not become lower than $-5$ V (a negative potential greater than 5 V in the absolute value) with respect to the potential of the substrate. Accordingly, when the potential of the interconnection portions becomes lower than $-5$ V with respect to that of the substrate, a p-type region 24 is provided in the surface part of an n-type substrate 25 lying in contact with an insulating layer 23 underneath the interconnection portions as shown in FIG. 5 and it is biased to the ground potential.

This suppresses the parasitic channel at the bottom part, because the p-type region works as a shield. In this way, the n+ low resistance layer portions 16–22 are isolated by high resistance layer portions 26 without being affected by the high potential of the n-type substrate 25. Shown at 2 is an $SiO_2$ film which corresponds to the $SiO_2$ film 10 in FIG. 1.

Figure 6:
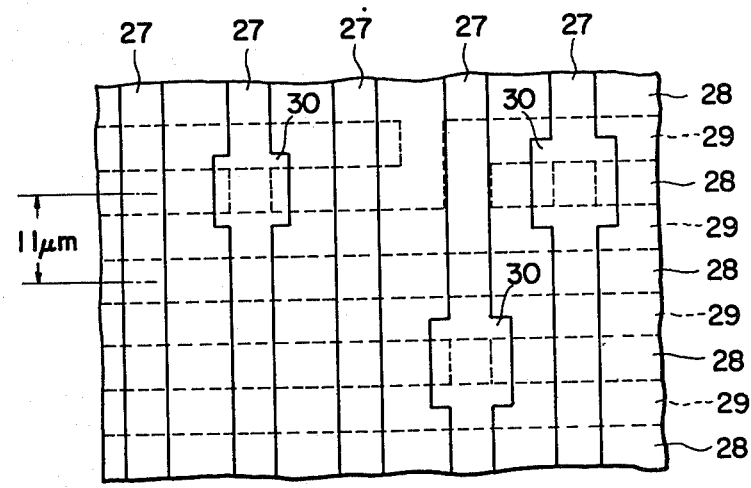
FIGS. 6 and 7 are plan views showing two different aspects of performance of the interconnection structure for a semiconductor integrated circuit according to this invention.

FIG. 6 is a plan view of an interconnection structure to which this invention is applied. Numeral 27 designates an Al interconnection, and numeral 28 a polycrystalline silicon interconnection, i.e., a low resistance portion. Numeral 29 indicates a high resistance portion for isolation, in which a through-hole 30 is provided as shown.

Figure 8:
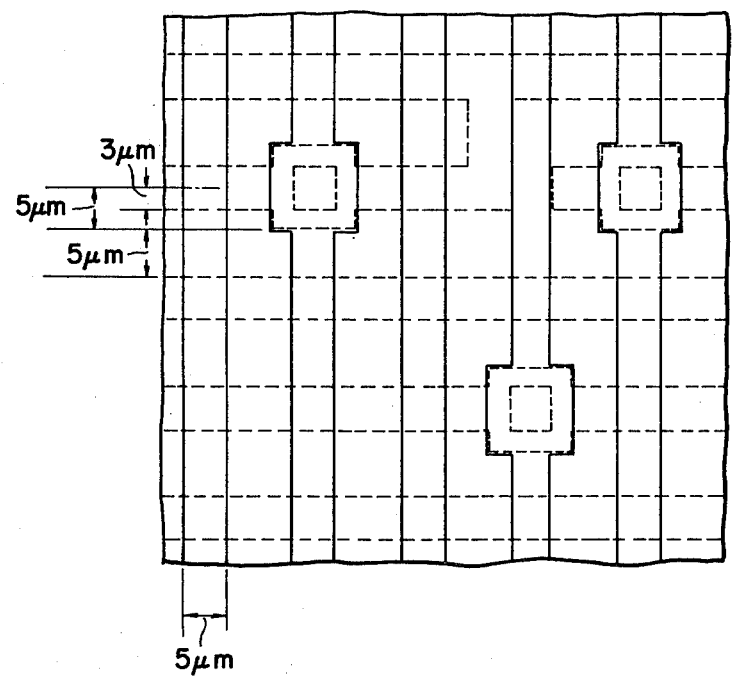
FIG. 8 is a plan view of a prior-art interconnection structure for a semiconductor integrated circuit corresponding to FIG. 6.

Owing to the application of this invention, even when the through-holes are out of registration with polycrystalline silicon interconnection patterns, the etching stops at the polycrystalline silicon layer of the high resistance portions, and hence, the mask alignment tolerances between through-holes and polycrystalline silicon interconnections become unnecessary, as can be seen in the figure. Accordingly, the interconnection area decreases by about 10–30%. When, by way of example, the interconnection structure of FIG. 6 is compared with a prior-art interconnection structure shown in FIG. 8, the interval between the adjacent polycrystalline silicon interconnections is shorter by 2 μm in the embodiment, and hence, the interconnection area is reduced by 15%. Moreover, since this structure is essentially flat, the breaking of the Al interconnections does not occur.

Further, this interconnection structure can be manufactured by applying a conventional semiconductor process as it is. For example, in a standard Si gate CMOS process, a polycrystalline silicon layer is deposited and is etched by the photolithography, in that p+ diffused layers and n+ diffused layers to become the p-channel and n-channel MOSFET's are formed. This step of diffusion is usually carried out by employing an $SiO_2$ film as a mask. At this stage, accordingly, those parts of the polycrystalline silicon layer which are to become the high resistance portions are covered with $SiO_2$. Thus, the desired interconnection structure can be formed without adding any processing steps.

Although, in the above, the interconnection structure shown in FIG. 6 has been described as having the sectional structure shown in FIG. 5, it is to be understood that the interconnection structure is similarly successfully applicable to a semiconductor integrated circuit having the sectional structure shown in FIG. 2.

EXAMPLE 3

Figure 7:
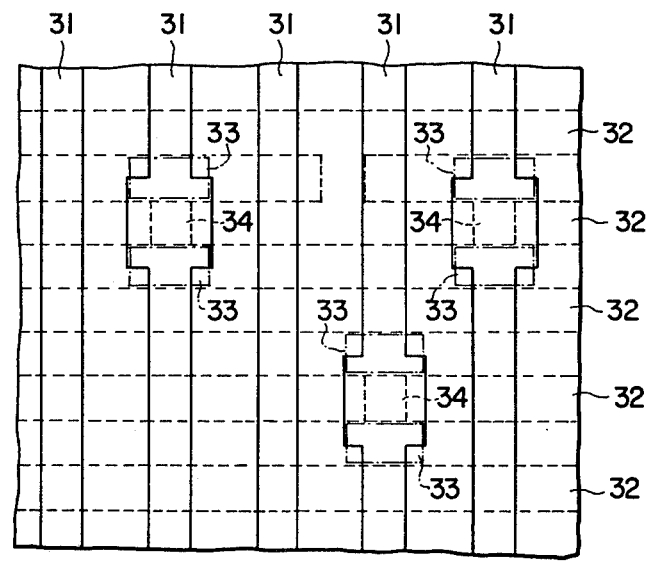

FIG. 7 is a plan view of another aspect of performance of the interconnection structure for a semiconductor integrated circuit according to this invention.

Numeral 31 designates an Al interconnection, and numeral 32 a polycrystalline silicon interconnection, i.e., a low resistance portion. Different from the aspect of performance shown in FIG. 6 is that high resistance portions 33 for isolation are left only around through-holes 34.

According to this aspect of performance, although there is a disadvantage that stepped parts appear, there is the advantage that the leak current flowing through the high resistance portions can be made still lower than in Examples 1 and 2.

It is to be understood that the layout shown in FIG. 7 is applicable to both the structure shown in FIG. 2 and the structure shown in FIG. 5. It is also to be understood that the interconnection structure of this embodiment is quite the same as the interconnection structure of FIG. 6 in that it is capable of making the interval of the polycrystalline silicon interconnections smaller than in the prior art.

What is claimed is:

1. An interconnection structure for a semiconductor integrated circuit, comprising:
    a semiconductor substrate,
    a first insulating film which is provided on said semiconductor substrate,
    low resistance polycrystalline silicon interconnections which have a predetermined pattern and which are provided on said first insulating film,
    a high resistance polycrystalline silicon layer which has substantially the same height as that of said low resistance polycrystalline silicon interconnections and which is provided on said first insulating film, in contact with the low resistance polycrystalline silicon interconnections, and in at least regions surrounding through-holes,
    a second insulating film which is provided so as to cover the low resistance polycrystalline silicon layer and said high resistance polycrystalline silicon layer except said through-holes, and
    metal interconnections which are provided on said second insulating film and which lie in electrical contact with said low resistance polycrystalline silicon interconnections through said through-holes.

2. An interconnection structure for a semiconductor integrated circuit according to claim 1, wherein said low resistance polycrystalline silicon interconnections are p-conductivity type.

3. An interconnection structure for a semiconductor integrated circuit according to claim 1, wherein both said substrate and said low resistance polycrystalline silicon interconnections are n-conductivity type, and a p-conductivity type layer is provided in a surface region of said substrate lying in contact with said first insulating film, said p-conductivity type layer being grounded.

4. An interconnection structure for a semiconductor integrated circuit according to claim 1, wherein said high resistance polycrystalline silicon layer has a sheet resistance of above 100 K$\Omega$/□.

5. An interconnection structure for a semiconductor integrated circuit according to claim 1, wherein said low resistance polycrystalline silicon interconnections have an impurity concentration of above $1 \times 10^{19}$ atoms/cm$^3$.

6. An interconnection structure for a semiconductor integrated circuit according to claim 1, wherein said low resistance polycrystalline silicon interconnections and said high resistance polycrystalline silicon layer cover the whole surface of said first insulating film.

7. An interconnection structure for a semiconductor integrated circuit according to claim 1, wherein said high resistance polycrystalline silicon layer is provided only in the regions surrounding said through-holes.

* * * * *